(12) United States Patent
Cox

(10) Patent No.: US 10,948,357 B2
(45) Date of Patent: Mar. 16, 2021

(54) SMART PARTS: EMBEDDED SENSORS FOR USE IN ADDITIVE MANUFACTURED PARTS

(71) Applicant: United States of America as represented by the Secretary of the Navy, San Diego, CA (US)

(72) Inventor: Stephen Charles Cox, San Marcos, CA (US)

(73) Assignee: United States of America as Represented by the Secretary of the Navy, Washington, DC (US)

( * ) Notice: Subject to any disclaimer, the term of this patent is extended or adjusted under 35 U.S.C. 154(b) by 287 days.

(21) Appl. No.: 16/023,268

(22) Filed: Jun. 29, 2018

(65) Prior Publication Data

US 2019/0346313 A1    Nov. 14, 2019

Related U.S. Application Data

(60) Provisional application No. 62/669,791, filed on May 10, 2018.

(51) Int. Cl.
*G01K 1/08*     (2021.01)
*G01K 1/14*     (2021.01)
*G01K 1/024*    (2021.01)
*B33Y 80/00*    (2015.01)
*G01B 7/16*     (2006.01)
(Continued)

(52) U.S. Cl.
CPC .............. *G01K 1/14* (2013.01); *B29C 64/379* (2017.08); *B33Y 10/00* (2014.12); *B33Y 80/00* (2014.12); *G01B 7/20* (2013.01); *G01K 1/024* (2013.01); *G06F 30/20* (2020.01); *G01B 2210/58* (2013.01)

(58) Field of Classification Search
CPC combination set(s) only.
See application file for complete search history.

(56) References Cited

U.S. PATENT DOCUMENTS 9,460,557 B1 * 10/2016 Tran ..................... B29C 64/386
2014/0172111 A1 * 6/2014 Lang ...................... A61F 2/389
                                                                 623/20.32
(Continued)

OTHER PUBLICATIONS

Yuanyuan Xu, Xiaoyue Wu, Xiao Guo, Bin Kong, Min Zhang, Xiang Qian, Shengli Mi, and Wei Sun; The Boom in 3D-Printed Sensor Technology; Sensors, 17, 1166; 2017.
(Continued)

*Primary Examiner* — Lisa M Caputo
*Assistant Examiner* — Nasir U. Ahmed
(74) *Attorney, Agent, or Firm* — Naval Information Warfare Center, Pacific; Kyle Eppele; James Eric Anderson

(57) ABSTRACT

A smart part comprising: a body, manufactured by a three dimensional (3D) additive manufacturing (AM) process, having high-stress and low-stress sections, wherein when the smart part is in operational use the high-stress section is subjected to higher stress than the low-stress section; a resistive strain gauge embedded within the body during the AM process at the high-stress section, wherein the strain gauge is configured to produce a variable output; and a temperature sensor embedded within the body during the AM process at the low-stress section, wherein the temperature sensor is configured to produce a variable output based on temperature.

18 Claims, 12 Drawing Sheets

(51) Int. Cl.
*B33Y 10/00* (2015.01)
*B29C 64/379* (2017.01)
*G06F 30/20* (2020.01)

(56) References Cited

U.S. PATENT DOCUMENTS

| | | | | |
|---|---|---|---|---|
| 2015/0048209 | A1* | 2/2015 | Hoyt | B64G 1/58 |
| | | | | 244/131 |
| 2016/0290880 | A1* | 10/2016 | Lewis | G06F 3/014 |
| 2016/0356866 | A1 | 12/2016 | Attridge | |

OTHER PUBLICATIONS

Tsai et al.; Additive manufacturing of Smart Parts with Embedded Sensors for In-Situ monitoring in Advanced Energy Systems; METL Crosscutting Technology Research Review Meeting, Pittsburgh, PA, 2017.

Leigh et al.; A Simple, Low-Cost Conductive Composite Material for 3D Printing of Electronic Sensors; PLoS ONE 7 (11): e49365. doi:10.1371/journal.pone.0049365; Editor: Jeongmin Hong, Florida International University, United States; 2012.

Lehmhus et al.; Customized Smartness: A Survey on links between Additive Manufacturing and Sensor Integration; 3rd International Conference on System-integrated Intelligence: New Challenges for Product and Production Engineering, SysInt 2016.

Waterman, Pamela J.; 3D-Printed Electronics Charge Ahead; Digital Engineering, available online at http://www.digitaleng.news/de/3d-printed-electronics-charge-ahead/; 2016.

Albakri et al.; Non-Destructive Evaluation of Additively Manufactured Parts via Impedance-Based Monitoring; Rapid Prototyping Journal, vol. 23 Issue: 3, pp. 589-601, https://doi.org/10.1108/RPJ-03-2016-0046; 2017.

Attridge et al.; Additively Manufactured IN718 Components with Wirelessly Powered and Interrogated Embedded Sensing; United States: N. p.,. Web. doi:10.2172/1369567. 2017.

Boersch, Jens; Temperature compensation o2016f strain gauges; webinar; HBM public;.

Wei, Li-Ju; The Fabrication of Integrated Strain Sensors for "Smart" Implants using a Direct Write Additive Manufacturing Approach; PhD thesis; De Montfort University Leicester UK; 2014.

Taubenrauch et al.; Printed strain gauges for aircraft load detection using Aerosol Jet® printing; Aerosol Jet® User Group Meeting Sep. 11 to 13, 2011.

Gooding et al; 3D Printed Strain Gauge Geometry and Orientation for Embedded Sensing; Conference Paper—Jan. 2017.

* cited by examiner

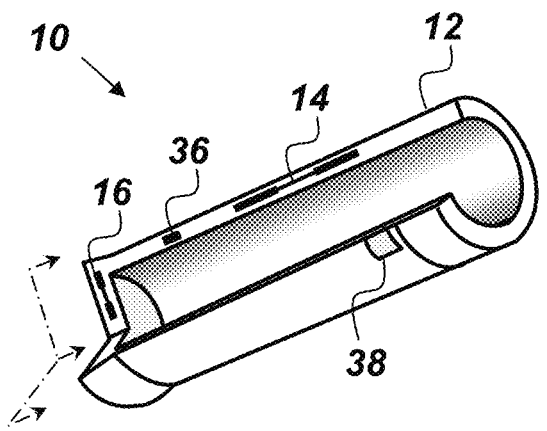
Fig. 4A
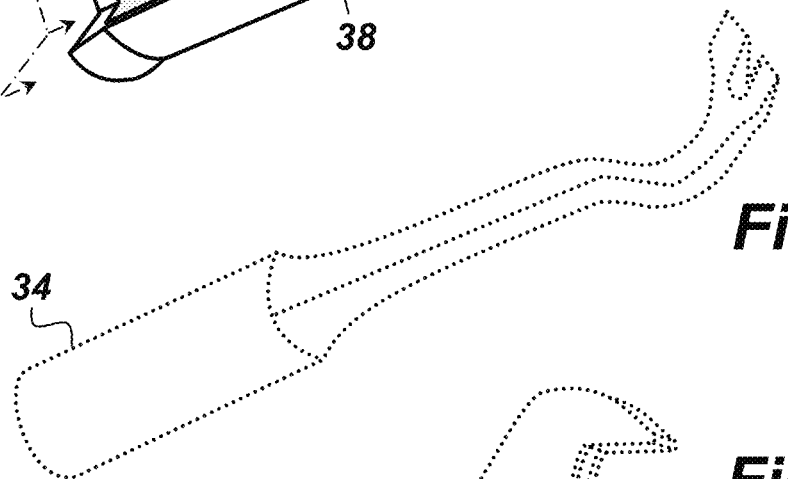
Fig. 4B
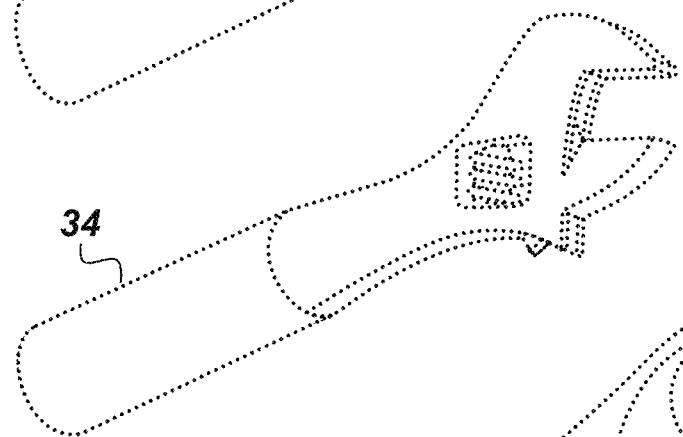
Fig. 4C
Fig. 4D

No Strain
Uniform Thickness

Under Operational Strain
Deformed Thickness

No Strain
Uniform Thickness

Under Operational Strain
Deformed Thickness

SMART PARTS: EMBEDDED SENSORS FOR USE IN ADDITIVE MANUFACTURED PARTS

CROSS-REFERENCE TO RELATED APPLICATION

This application claims the benefit of U.S. Provisional Application No. 62/669,791, filed 10 May 2018, titled "Smart Parts: Embedded Sensors for Use in Additive Manufactured Parts" (Navy Case #104160).

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 104160.

BACKGROUND OF THE INVENTION

The uses for 3 dimensional (3D) additive manufactured (AM) parts continues to explode and is creating a certification problem, not only for the computer models which can be simulated, but for individual parts, made from different stock lots, at different times, by different manufactures, stored under varying conditions and realized on different 3D Printers and other additive manufacturing hardware.

SUMMARY

Disclosed herein is a smart part comprising: a body, a resistive strain gauge, and a temperature sensor. The body is manufactured by a 3D AM process and has high-stress and low-stress sections. When the smart part is in operational use the high-stress section is subjected to higher stress than the low-stress section. The resistive strain gauge is embedded within the body during the AM process at the high-stress section and is configured to produce a variable output. The temperature sensor is embedded within the body during the AM process at the low-stress section and is configured to produce a variable output based on temperature.

The smart part may be non-destructively tested by performing the following steps. The first step provides for manufacturing the smart part body by a 3D AM process. Another step provides for printing conductive ink onto an interior high-stress section of the body during the AM process to create a resistive strain gauge embedded within the body. Another step provides for printing conductive ink onto an interior low-stress section of the body during the AM process to create a temperature sensor embedded within the body. When the smart part is in operational use the high-stress section is subjected to higher stress than the low-stress section. Another step provides for receiving outputs from the strain gauge and the temperature sensor at a monitoring device. Another step provides for calculating with the monitoring device a real-time, temperature-compensated stress experienced by the smart part based on the outputs from the strain gauge and the temperature sensor.

An embodiment of the smart part may be described as comprising a body and a plurality of strain gauges. The body is manufactured by a 3D AM process, having high-stress and low-stress sections. When the smart part is in operational use the high-stress section is subjected to higher stress than the low-stress section. The strain gauges are embedded within the body during the AM process. Each of the strain gauges is configured to fail after exposure to a different amount of stress so as to give a built-in history of the smart part's exposure to stresses.

BRIEF DESCRIPTION OF THE DRAWINGS

Throughout the several views, like elements are referenced using like references. The elements in the figures are not drawn to scale and some dimensions are exaggerated for clarity.

FIG. 4A is a perspective, partial-cut-away view of a hand grip embodiment of a smart part.

FIGS. 4B, 4C, and 4D are representations of various example hand tools designed to fit inside the hand grip embodiment of the smart part.

DETAILED DESCRIPTION OF EMBODIMENTS

The disclosed apparatus and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

With the advent of conductive inks, such as carbon, copper, and silver bases, a new ability exists of embedding multiple cheap sensors in an AM construct to not only verify the individual part performance, failure points, wear and useful life, but dynamic, "real-time" information which may be used to operate the systems of which the 3D AM part is a component, to meet a specific objective. This is especially important in aerospace and military applications. In an AM process, sensors and their circuit connections may be printed at the same time, (or nearly the same time if the process requires a tooling or machine change) or in the same operation as the AM structural fabrication process.

Figure 1:
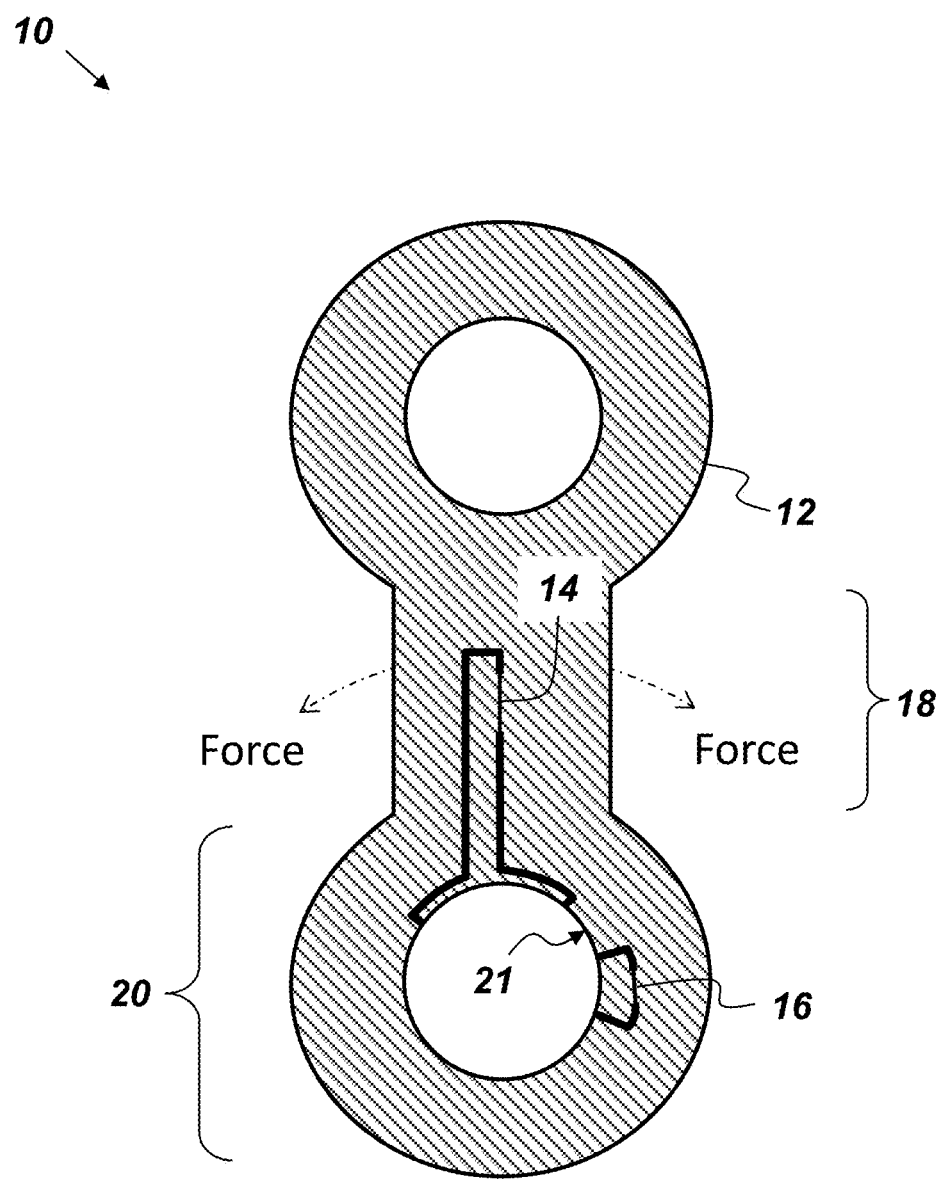
FIG. 1 is a cross-sectional, side-view illustration of a mechanical linkage embodiment of a smart part.

FIG. 1 is a cross-sectional, side-view illustration of a mechanical linkage embodiment of a smart part 10 that comprises, consists of, or consists essentially of a body 12, a resistive strain gauge 14, and a temperature sensor 16. The body 12 is a structure manufactured by a 3D AM process, and has at least one high-stress section 18 and at least one low-stress section 20. When the smart part 10 is in operational use the high-stress section 18 is subjected to higher stress than the low-stress section 20. The resistive strain gauge 14, which is configured to produce a variable output, is embedded within the body 12 during the AM process at the high-stress section 18. The temperature sensor 16 is embedded within the body 12 during the AM process at the low-stress section 20. The temperature sensor 16 is configured to produce a variable output based on temperature.

Figure 7:
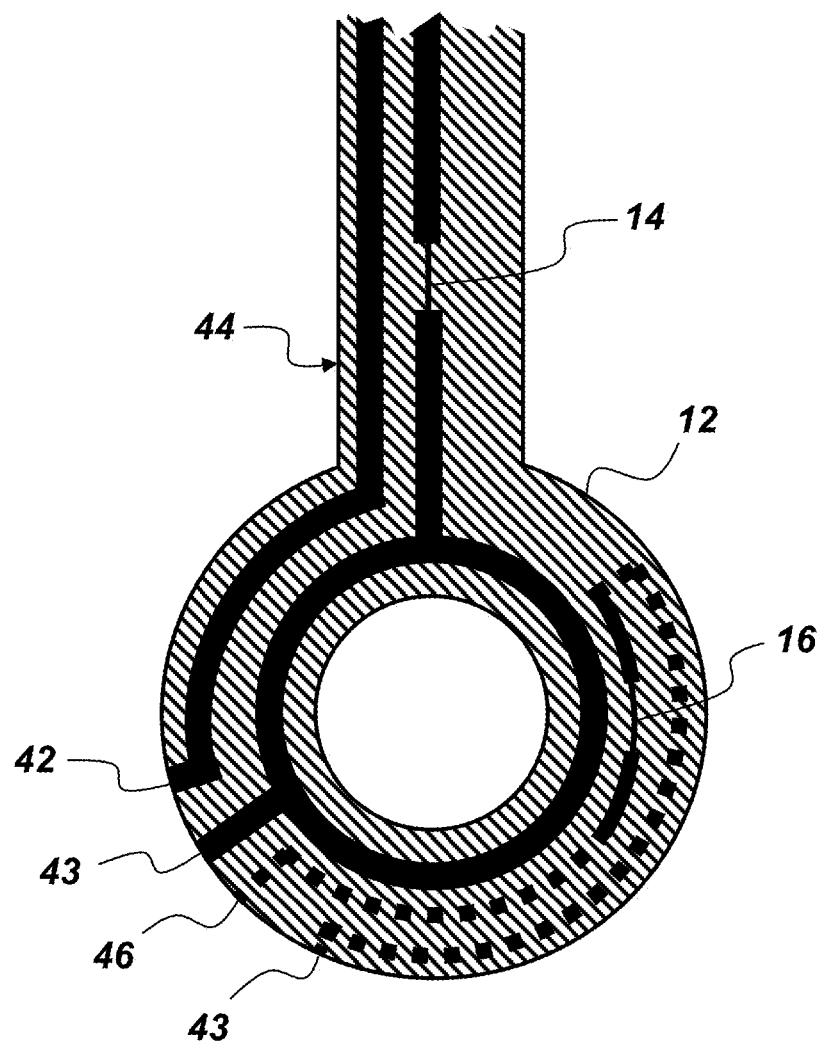
FIG. 7 is a partial, cross-sectional view of a mechanical linkage embodiment of a smart part.

A suitable example embodiment of the temperature sensor 16 is a conductive trace printed with conductive ink on the body 12 during the AM process so as to end up as embedded within the body 12 at the end of the AM process. The conductive trace of the afore-mentioned embodiment of the temperature sensor 16 may have a necked-down section (such as the necked-down section 32 shown in FIG. 3B). The embodiment of the temperature sensor 16 shown in FIG. 1 is configured to produce a variable electrical resistance based on temperature. Another suitable embodiment of the temperature sensor 16 is a thermocouple where different conductive inks (such as copper and silver) are printed, one directly on top of the other, to create a junction of dissimilar metals capable of generating a micro voltage. Such a thermocouple is depicted in FIG. 7 where the dotted line of the temperature sensor 16 represents a first conductive ink trace and the solid line represents a second conductive ink trace. In the embodiment of the temperature sensor 16 shown in FIG. 1, the ends of the conductive traces are routed to the exterior of the body 12 where data can be read by direct electrical connection. For example, a standard electrical connector may be attached to the ends of conductive traces to communicate the information to a recording, monitoring, and/or control system (not shown). Other thermocouples could be printed in other areas of the smart part 10 including the high stress section 18. Dividing out a forcing function from two different sensors (e.g. strain gauge 14 and the temperature sensor 16) allows one to account for strain caused by temperature variations so as to be able to obtain a more accurate measurement of the stress experienced by the smart part 10.

A series of thermocouple junctions may be printed into the body 12 to realize a "thermopile"; a direct current source for use as instrumentation reporting, or a base-signal reporting, monitoring, and control current for arrays of resistive elements of monitoring traces. Such a signal would have an alternating current (AC) component, due to physical oscillations of stresses during operation and testing, which AC signal could further be used to report integrity and performance of the body 12 in which the sensors are embedded. Similar arrangements of conductive traces can be used for circuit runs for these sensor arrays. For example, circuit runs may be printed with conductive inks to lead from a sensor to a central point on the body 12 where a standard electrical connector may be attached to communicate the information to a recording, monitoring, and/or control system. For example, in FIGS. 1 and 7, conductive traces connected respectively to the temperature sensor 16 and the strain gauge 14 lead to an exterior surface 21 of the body 12.

Embodiments of the strain gauge 14 can be embedded in the body 12 by printing, during the AM process, a trace of conductive ink with a necked-down section located in the high stress region 18, such as is shown in FIG. 1. The necked-down section is sized to produce electrical resistance in a meaningful scale, which will vary by application. In the embodiment of the strain gauge 14 shown in FIG. 1, conductive traces are printed in the body 12 so as to lead to a location on the body 12 where a measurement device may be attached to the smart part 10 and/or where a standard electrical connector may be attached to facilitate the measuring of the resistance from the strain gauge 14.

In reference to the embodiment of the smart part 10 shown in FIG. 1, deformation of the body 12 due to operational stresses would in turn cause deformation of the embedded strain gauge 14, which would result in an increased resistance, due to the thinning of the layer of conductive ink. While the strain gauge 14 is experiencing deformation due to operation stress in the high stress section 18 of the body 12, the temperature sensor 16 is experiencing minimal physical force stress in the low stress section 20, which in this embodiment is the "hub" of the linkage. The temperature sensor 16 provides a temperature reference. Increased temperature would be read as increased resistance, due to a positive temperature conduction coefficient of most conductive inks used in 3D AM. Mathematics may be performed to "divide out" temperature differences and to maintain correct scale and amplitude information from strain sensors.

Figure 2:
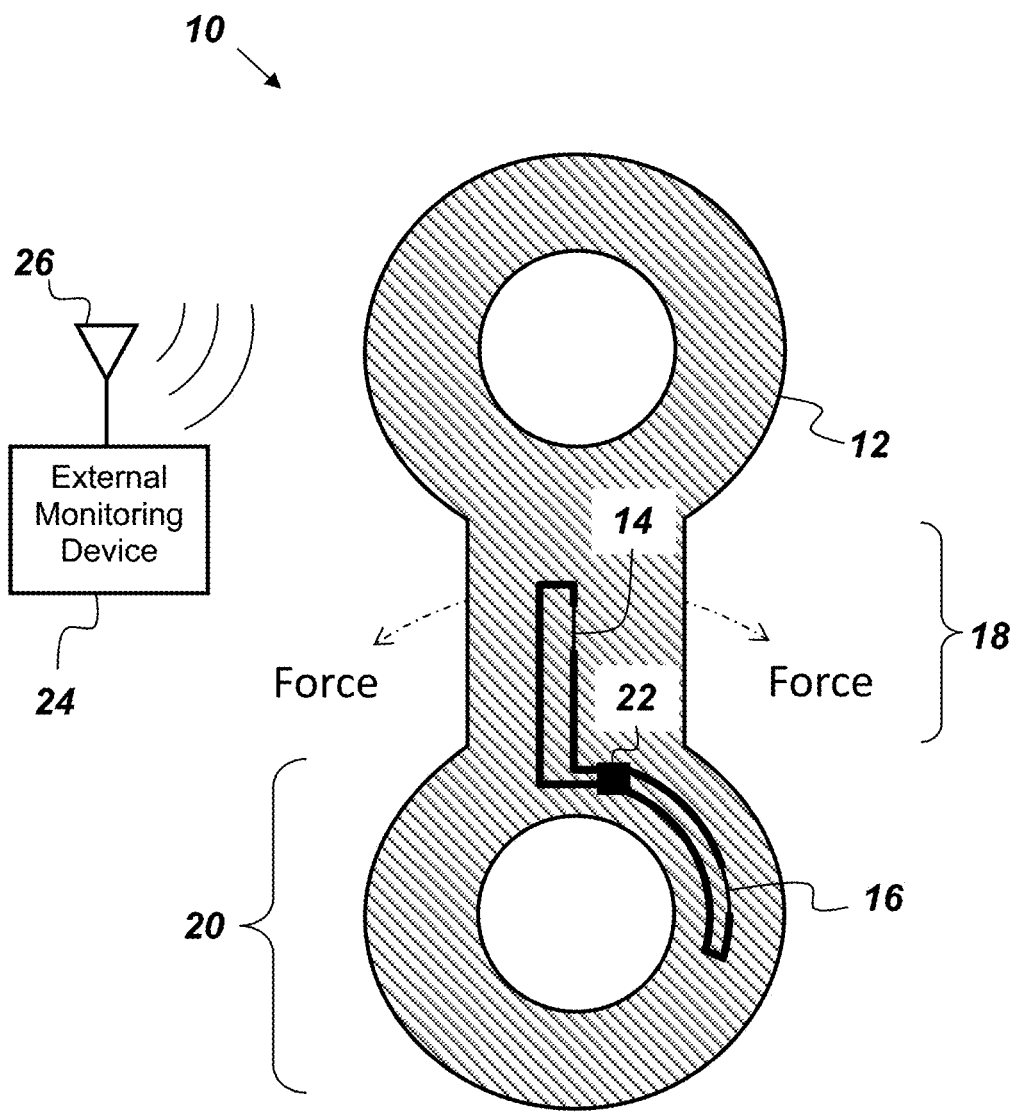
FIG. 2 is a cross-sectional, side-view illustration of a mechanical linkage embodiment of a smart part.

FIG. 2 is a cross-sectional, side-view illustration of an embodiment of the smart part 10 where the temperature sensor 16 is a conductive trace with a necked-down section that provides a variable/temperature-dependent resistance. In this embodiment of the smart part 10 the temperature sensor 16 and the strain gauge 14 are both electrically connected to a passive radio frequency identification (RFID) transponder or tag 22 that is also embedded in the body 12. The RFID transponder 22 may be printed directly into the body as part of the AM process or it may be on a separate circuit that is added during a break in the AM fabrication process, during which break, the RFID circuit may be connected to the conductive ink traces leading to the temperature sensor 16 and the strain gauge 14. After the break, the AM process continues and prints over the RFID circuit yielding a circuit embedded and integral to the smart part 10. The RFID transponder 22 enables wireless power and data transfer to/from sensors embedded within the body 12 and an external monitoring device 24 that is configured to calculate a temperature-compensated stress experienced by the smart part 10 based on the outputs of the strain gauge 14 and the temperature sensor 16. In this embodiment of the smart part 10, no conductive traces lead to any exterior surfaces of the body 12. It may be desirable for some embodiments of the smart part 10 to include both an embedded RFID transponder 22 and conductive traces leading from the embedded sensors to an exterior surface of the body 12.

The RFID transponder 22 may be any passive RFID circuit. Typical RFID transponders comprise an antenna and a microprocessor designed to incorporate the functions of a central processing unit (CPU) onto a single semiconducting integrated circuit (IC), as is known in the art. The RFID transponder's antenna (an example of which is shown in FIG. 3) is the conductive element that enables the transponder to send and receive data. Passive, low- (135 kHz) and high-frequency (13.56 MHz) tags or transponders usually have a coiled antenna that couples with the coiled antenna of a reader, such as the external monitoring device 24, to form a magnetic field. The passive RFID transponder 22 does not come with its own power source and transmitter. When radio frequency (RF) waves from a reader (such as the external monitoring device 24) reach the RFID transponder's antenna, the energy is converted by the RFID transponder's antenna into electricity that can provide power to the microprocessor. The RFID transponder 22 is able to send information stored on the microprocessor back to the external monitoring device 24. A suitable example of the passive RFID transponder 22 includes, but is not limited to, an ultra-high frequency (UHF) 860-960 MHz Web RFID tag.

The external monitoring device 24 may be any hand-held instrument which can read data from the strain gauge 14 and the temperature sensor 16. The external monitoring device 24 comprises an antenna 26 which can be used to emit radio waves. The RF energy from the antenna 26 is "harvested" by the passive RFID's antenna and used to power the RFID's microprocessor, which then changes the electrical load on the RFID's antenna to reflect back its own signals. In other words, the external monitoring device 24 sends out an RF "pulse", stimulating the embedded sensors (temp/strain) within the body 12 with the RFID transponder 22. The energy from the pulse is collected, by the RFID's antenna, rectified by the RFID's transponder 22, and becomes direct current (DC), which is then used to power the embedded sensors of the smart part 10. Once powered, the embedded RFID transponder 22 then transmits the data as read from the temperature sensor 16 and the strain gauge 14. The cycle may repeat at fractions of a second to provide real-time continuous readout of data regarding the smart part 10 while in operation and in communication with the external monitoring device 24 without having to disconnect or dismantle the smart part 10.

Figure 3A:
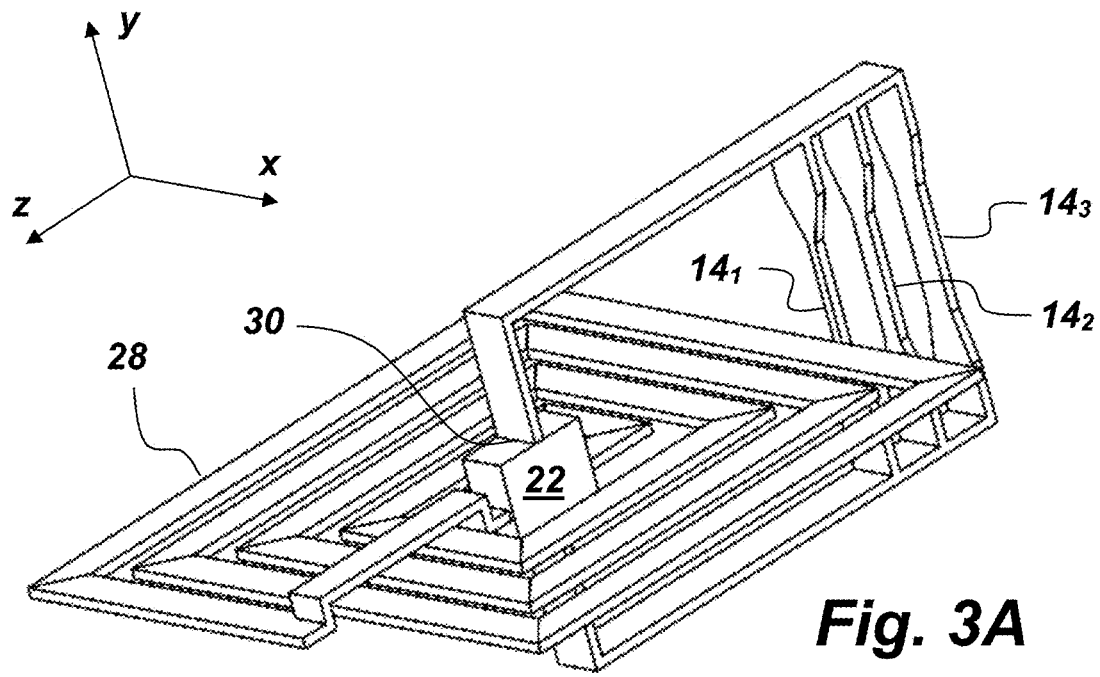
FIG. 3A is a perspective view illustration of an embodiment of an RFID transponder that is electrically connected to a plurality of resistive strain gauge sensors.

FIG. 3A is a perspective view illustration of an embodiment of the RFID transponder 22 that is electrically connected to a plurality of resistive strain gauge sensors $14_1$-$14_n$. In this embodiment, there are depicted three separate strain gauges 14, but it is to be understood that there could be any desired number of embedded strain gauges 14. In this embodiment, the antenna of the RFID transponder 22 is represented by the coil loop 28, which, by way of example, may be made of silver ink. The RFID transponder 22 and coil loop 28 shown in FIG. 3A may be a commercial off-the-shelf (COTS) component that is added to the smart part 10 during a break in the AM process. Such COTS RFID transponders 22 and coil loops 28 often come from the manufacturer on sheets much like adhesive-backed labels. The RFID transponder 22 shown in FIG. 3A has a contact on the top and bottom where an AM attachment may be made to electrically connect the plurality of strain gauge sensors $14_1$-$14_n$ to the transponder 22. The top contact 30 is shown in FIG. 3A. The bottom contact is not visible in FIG. 3A.

Figure 3B:
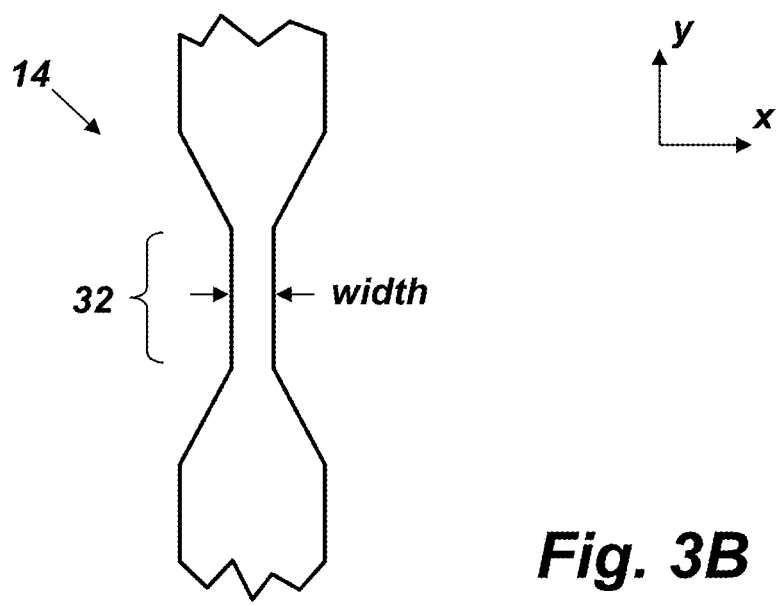
FIG. 3B is a two dimensional representation of a strain gauge sensor.

FIG. 3B is a two dimensional representation of one of the strain gauge sensors $14_1$-$14_n$ shown in FIG. 3A. As shown in FIGS. 3A and 3B each of the plurality of strain gauge sensors $14_1$-$14_n$ is "dog-bone-shaped" having a necked-down section 32. The width of the necked-down section 32 is different for each of the plurality of strain gauge sensors $14_1$-$14_n$. Together, the plurality of strain gauge sensors $14_1$-$14_n$ cumulatively create a strain gauge with memory. When interrogated by the external monitoring device 24 the transponder 22 of FIG. 3A measures and reports resistance in ohms back to the external monitoring device 24. The more strain experienced by the smart part 10 the higher the resistance reported back to the external monitoring device 24. Breaks to any of the individual strain gauges $14_1$-$14_n$ results in an even higher overall resistance, which is reported on a scale such that the force experienced by the body 12 may be gauged. This is not just a "yes or no" data point. In other words, the resistance measured by the external monitoring device 24 is not just an integer or a digital (1 or 0) value, but it can be designed to provide resistance information on a scale with linear (or exponential) resolution. For example, the plurality of strain gauge sensors $14_1$-$14_n$ may be designed to cumulatively provide a resistance from 1-100 ohms, telling how much force was exerted against the strain gauge sensors $14_1$-$14_n$. Arrays of strain gauge sensors 14 may be made in any or all directions (X-Y-Z) and at any desired angle, so that the force in a critical/desired dimension may be measured.

Objective evidence of the history of the smart part 10 can be built into the body 12. For example, the voltage return of the strain gauge sensor 14 can be designed to change permanently after exposure to high heat that leads to oxidation between contacts (e.g., silver and silver oxide), which could indicate that the part has been compromised. Further, some strain gauge sensors 14 in an array can be designed to break after exposure to a given level of stress. Subsequent testing of the smart part 10 either with the external monitoring device 24 or by connecting to conductive traces at the surface (depending on the embodiment) will allow one to know the extent of the heat or stress that the smart part 10 has been exposed to. This can be advantageous in that it provides a way to certify that a 3D printed part meets minimum standards and/or is still serviceable. Similarly, the smart part 10 may comprise a plurality of temperature sensors 16 embedded within the body 12 during the AM process. Each of the temperature sensors 16 may be configured to fail after exposure to a different temperature so as to give a built-in history of temperature levels to which the smart part 10 has been exposed. Peltier junction elements may be used to make the smart part 10 cold, to read in real time, and/or record the history of the part.

Here is an example manufacturing process for embedding the transponder 22 shown in FIG. 3A into the smart part 10. In this example, the body 12 is plastic (non-conductive), and the sensors (i.e., strain gauges $14_1$-$14_3$) are printed in conductive material (e.g. metal ink, fiber, etc.). The AM process would additively print the body 12, layer by layer, with the sensor, in this case the strain gauges $14_1$-$14_3$, inside the part, up to the plane of the coil loop 28. At this point the printing would pause and the transponder 22 and the coil loop 28 may be "peeled" from a sheet and "stuck" to its small divot in the body 12. After that, the print completes, finishing the strain gauges $14_1$-$14_3$ and encapsulating the strain gauges $14_1$-$14_3$, the transponder 22, and the coil loop 28 all within the body 12. AM printers may be modified to pause prints and automatically build as described above in the same way that "pick-and-place" machines put parts on circuit boards as is known in the art.

The external monitoring device 24 may be any RFID reader. For example, the external monitoring device 24 may be an RFID reader that is built into a mobile phone. Different combinations of strain gauge sensors 14 and temperature sensors 16 may be distributed throughout different high and low stress zones of the body 12. Especially in high stress zones, it is desirable to embed multiple strain gauge sensors 14 to provide redundancy.

FIG. 4A is a perspective, partial-cut-away view of a hand grip embodiment of the smart part 10. FIGS. 4B, 4C, and 4D are representations of various example hand tools 34 that can fit inside the hand grip. In this embodiment, the body 12 serves as a detachable hand grip for a hand tool 34. The hand grip embodiment of the smart part 10 comprises a monitoring device 36 and a display 38. The monitoring device 36 is physically mounted within the body 12 and is connected to the strain gauge 14 and to the temperature sensor 16. The display 38 is mounted to the body 12 and electrically connected to the monitoring device 36. The monitoring device 36 is configured to calculate a temperature-compensated torque being applied to the hand tool 34 based on the outputs of the strain gauge 14 and the temperature sensor 16. The display 38 is configured to display the torque calculated by the monitoring device 36.

Figure 5A:
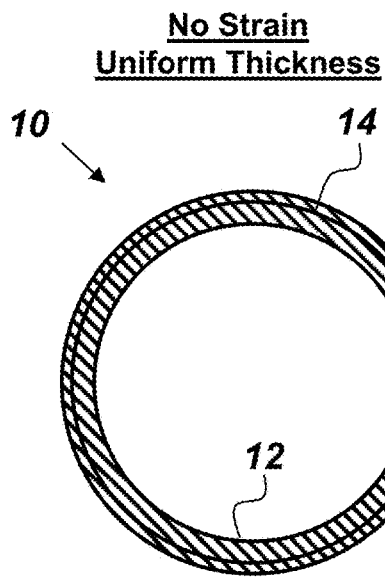
FIGS. 5A and 5B are cross-sectional views of a container embodiment of a smart part.
Figure 5B:
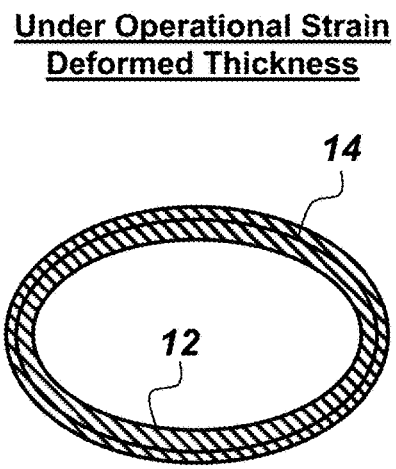
Figure 5C:
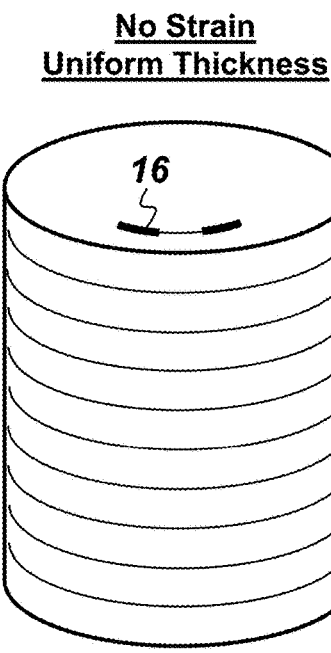
FIGS. 5C and 5D are perspective view illustrations of another embodiment of a smart part.
Figure 5D:
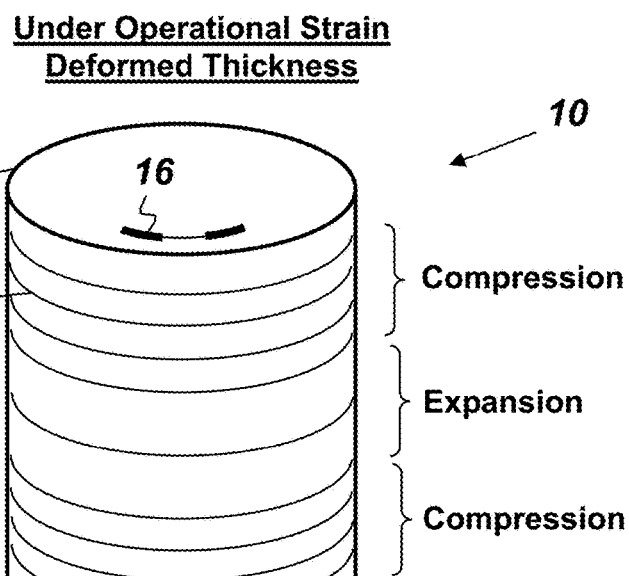

FIGS. 5A and 5B are cross-sectional views of an embodiment of the smart part 10 where the body 12 is a container such as a fuel tank. The strain gauge 14 in this embodiment may be realized with a continuous conductive ink trace at a constant concentric elevation. FIG. 5A shows the body 12 under a no-strain condition. FIG. 5B represents the body 12 under operational strain. Stresses in the tank taking the tank "out of round" would be recorded as changes in electrical resistance in the strain gauge 14. Multiple band traces (e.g., strain gauges 14) at spaced elevations may be used allow data to be reported over the entire structure of the body 12. FIGS. 5C and 5D are perspective view illustrations of an embodiment of the smart part 10 where the body 12 is a cylindrical pressure vessel with multiple embedded strain gauges 14. FIG. 5C shows the body 12 when not under stress. A plurality of strain gauges 14 are shown in FIG. 5C as bands of conductive ink. In practice, the strain gauges 14 and the temperature sensor 16 would not be visible (unless the body 12 were transparent) as the strain gauges 14 and the temperature sensor 16 would be embedded in the body 12, but they are shown in FIG. 5C to aid in understanding this embodiment of the smart part 10. FIG. 5D shows the body 12 under operational stress where the body 12 is being compressed in some places and expanded in other areas. The change in distance between the strain gauges 14 would result in changes in electrical resistance, which may be measured and used to determine the stresses being experienced by the smart part 10.

Figure 6A:
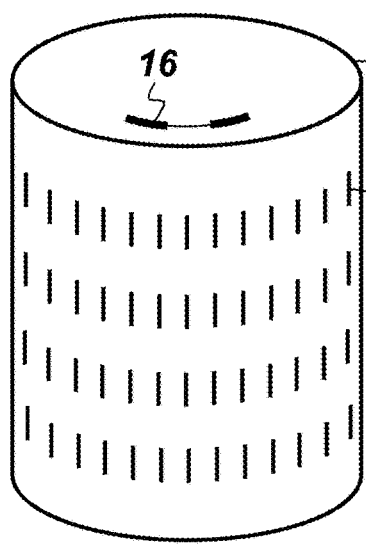
FIGS. 6A and 6B are perspective views of another embodiment of the smart part.
Figure 6B:
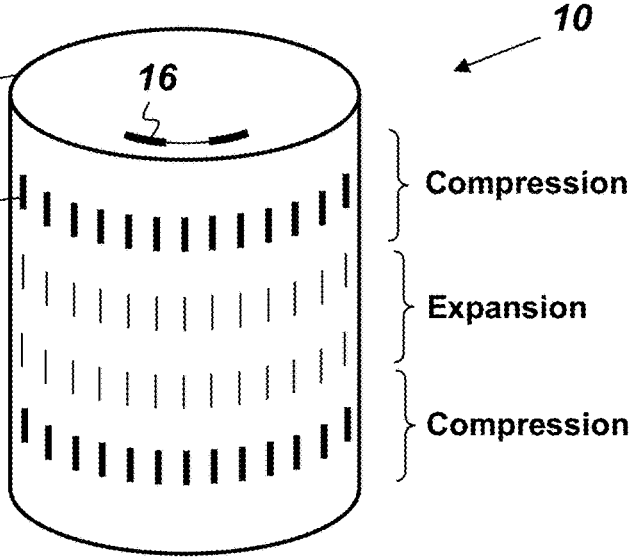

FIGS. 6A and 6B are perspective views of another embodiment of the smart part 10 where the strain gauges 14 are positioned as longitudinal strain gauges with necked down sections realized as short axial arrays in concentric bands around the body 12, which in this embodiment is a cylindrical container. In this embodiment of the smart part 10, temperature compensation is realized by using similar necked down conductive traces (i.e., temperature sensors 16) at points in the body 12 where stresses are less or less important (i.e., the end caps of the cylindrical container. The temperature sensors 16 produce an electrical resistance based on temperature. As with FIGS. 5C and 5D, in practice, the strain gauges 14 and the temperature sensors 16 would be embedded in the body 12, but they are illustrated in FIGS. 6A and 6B to aid in understanding this embodiment of the smart part 10. In FIG. 6A, there is uniform spacing between the various strain gauges 14 when the body 12 is not under operational stress. In FIG. 6B, the body 12 is shown as being under operational stress such that some of the strain gauges 14 are being compressed and others are being stretched. The spacing between the concentric bands may vary as well depending on the stress.

Figure 6C:
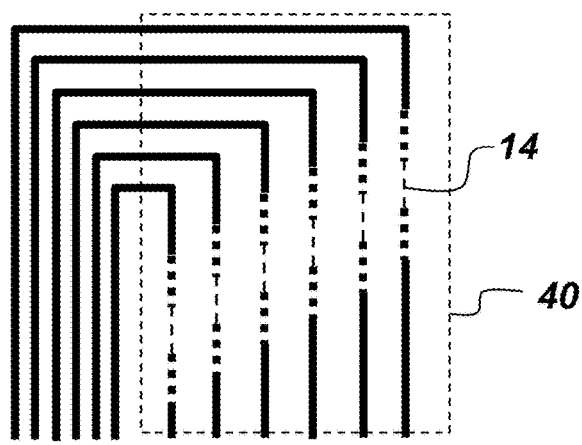
FIG. 6C is an illustration of such a zone of a smart part comprising a plurality of strain gauge sensors.

An off structure recording, monitoring, and/or control system, such as the external monitoring device 24, shown in FIG. 2, may be configured to perform mathematics "dividing out" temperature differences and maintaining correct scale and amplitude information from the strain gauges 14 and the temperature sensors 16. Sensors may be organized by zone and designed to provide redundancy such that should one sensor fail, each zone will always have at least one operational sensor. FIG. 6C is an illustration of such a zone of strain gauge sensors 14. FIG. 6C shows a sensor-monitored zone 40 of six strain gauges 14 made of conductive ink with necked-down sections. Electrical connections to the strain gauges 14 may be organized into busses. It is to be understood that beyond container embodiments (e.g., pressurized fuel tanks) shown in FIGS. 6A and 6B, a similar opportunity exists for all AM parts and may form the basis for qualification of a material, process, and particular part for a given application. In addition to receiving information wirelessly from the strain gauges 14 and the temperature sensors 16 with the external monitoring device 24, signals, resistances and other electrical data may be read using contacts which also may be printed in conductive inks.

FIG. 7 is a partial, cross-sectional view of a mechanical linkage embodiment of the smart part 10. In this embodiment, first and second conductive contacts 42 and 43 respectively are connected to the strain gauge 14 and are routed to a surface 44 of the body 12 where the conductive contacts 42 and 43 may serve as electrical contacts for external instrumentation for measuring the resistance of the strain gauge 14. The temperature sensor 16, in this embodiment, is connected to first and second temperature contacts 46 and 47 respectively. The first and second temperature contacts 46 and 47 are routed to a surface 44 of the body 12 where the conductive contacts 46 and 47 may also serve as electrical contacts for external instrumentation for measuring the resistance of the strain gauge 14. The conductive contacts 42, 43, 46, and 47 may each take the form of a contact pin in electrical connection with their respective sensors. Contact pins may be inserted as part of the AM fabrication process for use with a standard electronic connector.

Figure 8:
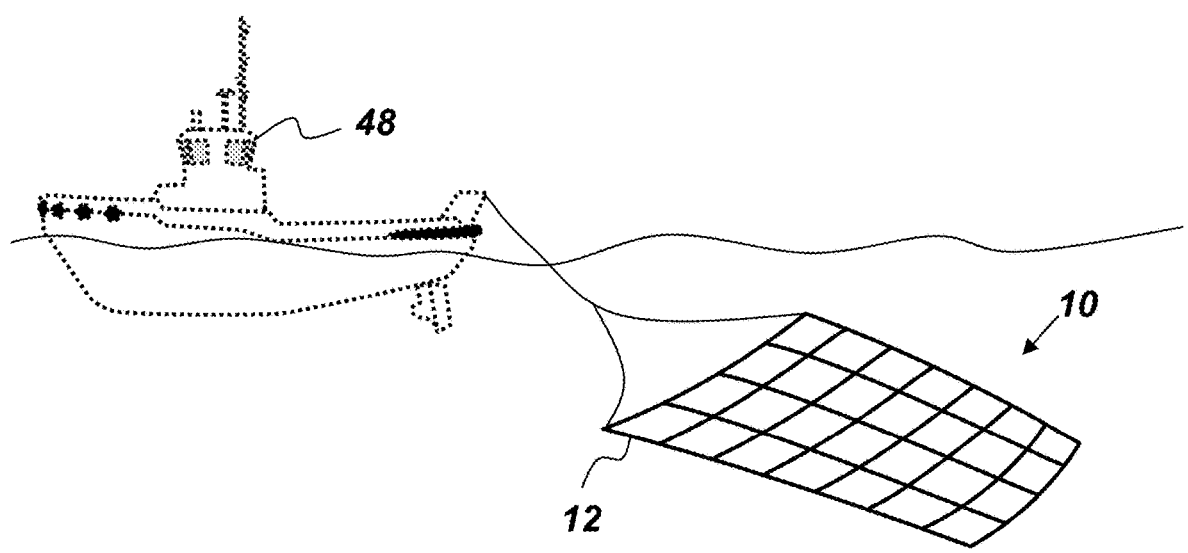
FIG. 8 is an illustration of a sonar embodiment of a smart part.

FIG. 8 is an illustration of a sonar embodiment of the smart part 10. In this embodiment of the smart part 10, active or passive sensors are embedded at regular intervals in the body 12, which, in this embodiment is a webbing type "fish net," which may be towed by different vessels (such as the boat 48) as a towed array or anchored on the sea floor. This embodiment of the smart part 10 functions as an underwater sonar network sensor. The fish net provides spacing between strain gauges 14 and temperature sensors 16 embedded in the webbing. In this embodiment, the strain gauges 14 and temperature sensors 16 would provide net strain and temperature information respectively. This information is commonly used in ocean engineering. In addition to the strain gauges 14 and temperature sensors 16, additional sensors for electro-magnetic fields (e.g., 3D-printed magnetometers with hair-fine detection junctions) may be embedded in the net-shaped body 12. The electromagnetic field sensors would be useful in detecting maritime threats such as mines, subs, divers, etc. This net embodiment of the smart part 10 could be placed on the bottom of a guard area in advance and then provide security intrusion information based on changes in the earth's magnetic field strength as a ferrous object passes over the net, rendering the ferrous object passively detectable. Such sensor nets exist, but consist of multiple electronics modules sewn into a fish net. The net embodiment of the smart part 10 can be made to have multiple redundant sensors. The net embodiment of the smart part 10 would be cheaper, lighter, and provide increased capabilities over prior art sonar nets where sensors are sewn into nets.

Figure 9:
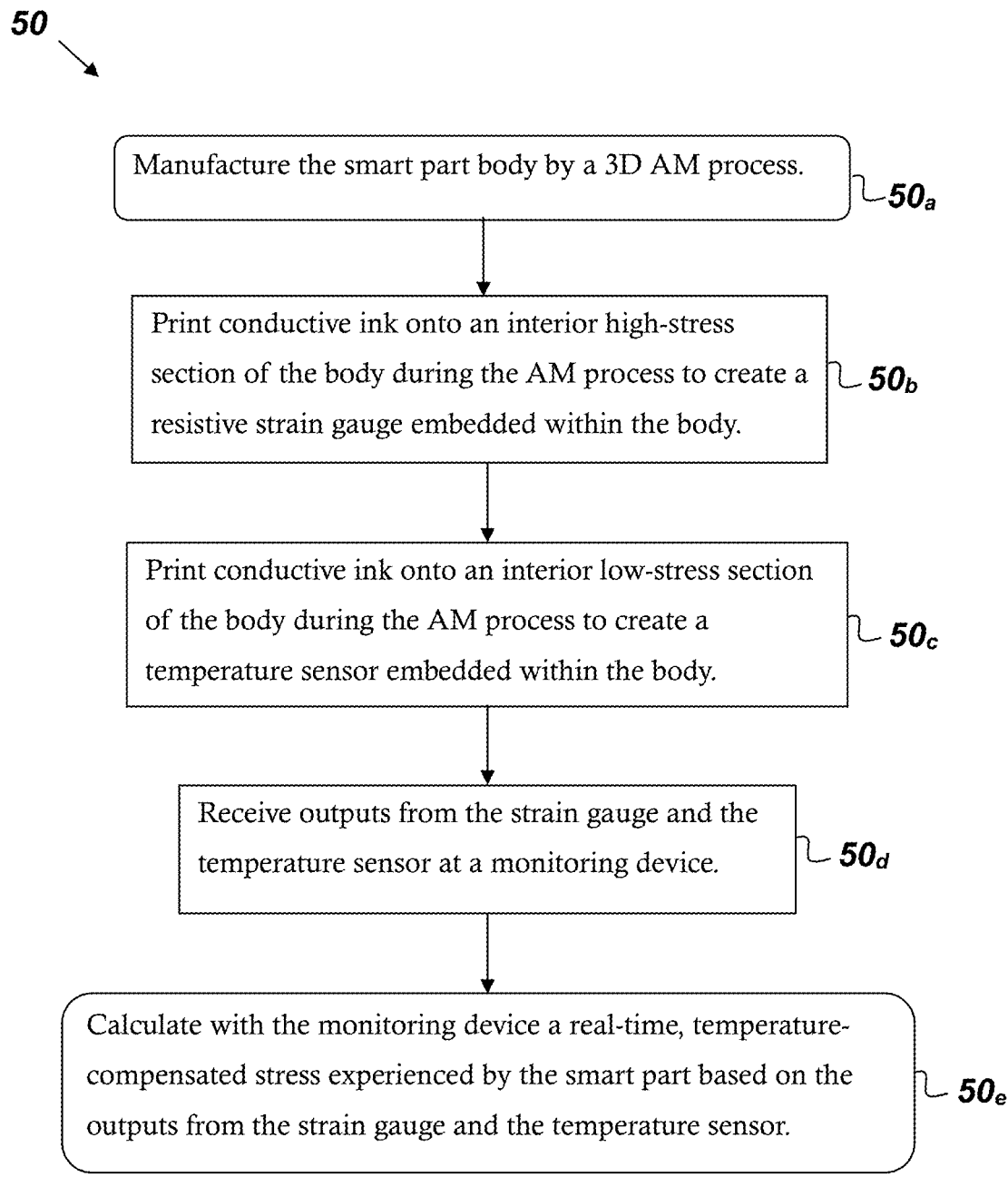
FIG. 9 is a flowchart of a method for non-destructively testing a 3D AM smart part.

FIG. 9 is a flowchart of a method 50 for non-destructively testing a 3D AM smart part. The first step $50_a$ provides for manufacturing the smart part body by a 3D AM process. The next step $50_b$ provides for printing conductive ink onto an interior high-stress section of the body during the AM process to create a resistive strain gauge embedded within the body. The next step $50_c$ provides for printing conductive ink onto an interior low-stress section of the body during the AM process to create a temperature sensor embedded within the body. When the smart part is in operational use the high-stress section is subjected to higher stress than the low-stress section. The next step $50_d$ provides for receiving outputs from the strain gauge and the temperature sensor at a monitoring device. The next step $50_e$ provides for calculating with the monitoring device a real-time, temperature-compensated stress experienced by the smart part based on the outputs from the strain gauge and the temperature sensor.

Figure 10A:
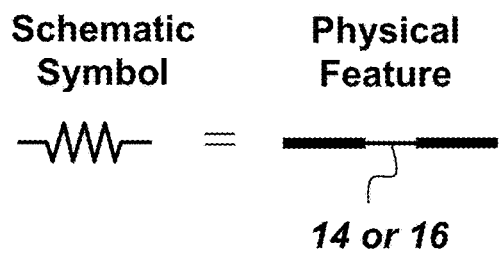
FIGS. 10A-10F are comparisons of various printed sensor embodiments with their electrical schematic equivalents.
Figure 10B:
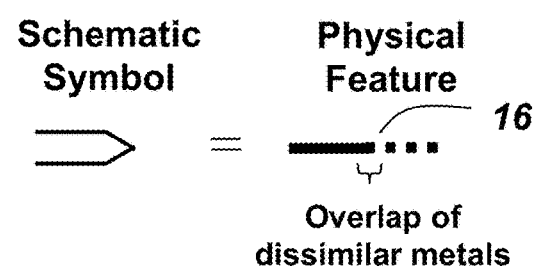
Figure 10C:
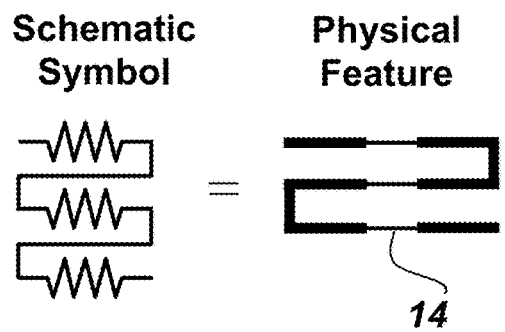
Figure 10D:
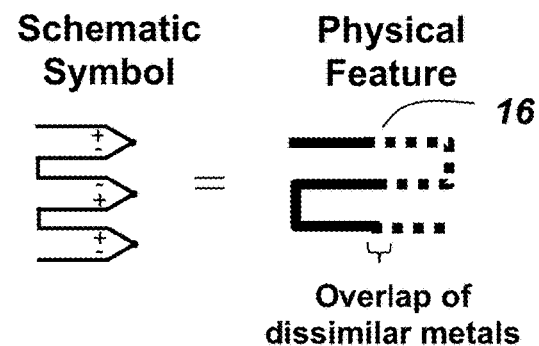
Figure 10E:
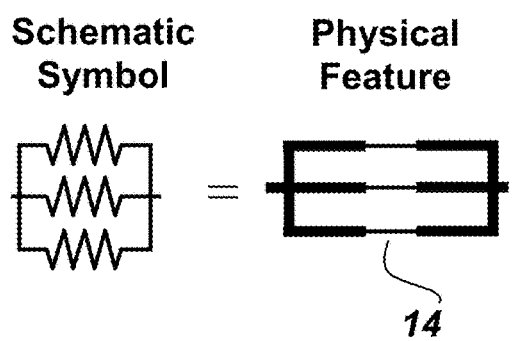
Figure 10F:
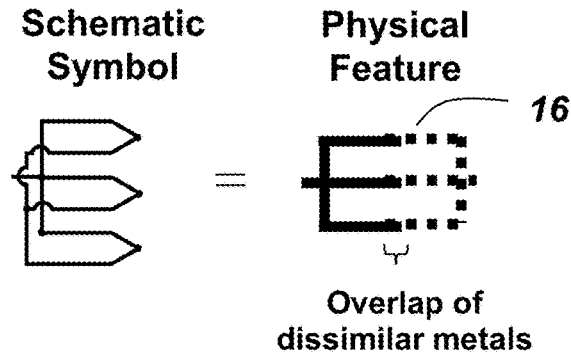

FIGS. 10A-10F are comparisons of various printed sensor embodiments with their electrical schematic equivalents. FIG. 10A shows the schematic symbol of a resistor next to a resistive element comprised of a printed trace with a necked-down section, that may be used for the strain gauge 14 or the temperature sensor 16. FIG. 10B shows a design for a thermocouple that may serve as the temperature sensor 16 that comprises two dissimilar metals represented by the solid and dotted lines that overlap and are in contact with each other. FIG. 10C shows an embodiment of redundant strain gauges 14, each strain gauge 14 having a geometrically necked-down section. FIG. 10D shows an embodiment of redundant temperature sensors 16 where one conductive ink is represented by the solid trace and another, dissimilar conductive ink is represented by the dotted trace. FIGS. 10E and 10F show parallel configurations of embodiments of the strain gauge 14 and the temperature sensor 16 respectively.

Figure 11:
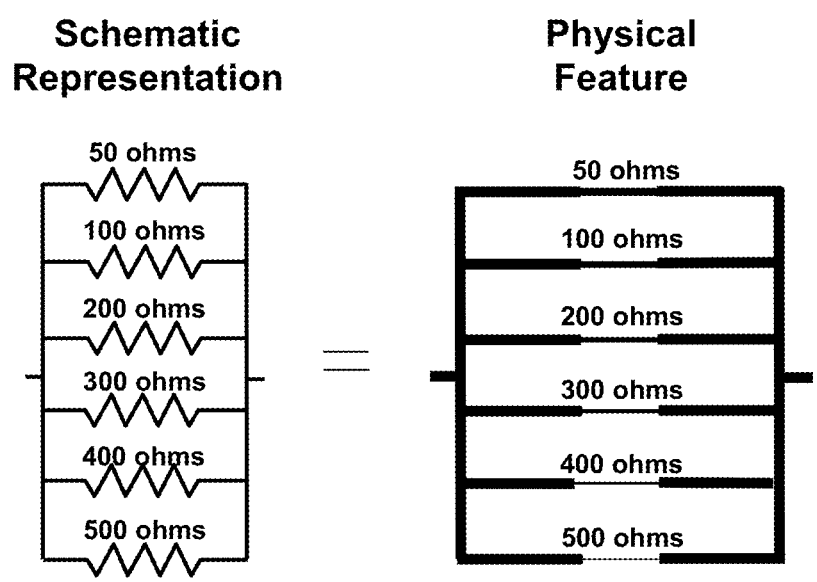
FIG. 11 is a representation of a plurality of parallel strain gauges.

FIG. 11 is a representation of a plurality of parallel strain gauges 14, with each strain gauge 14 having a different resistance. Together, the plurality of resistive strain gauges 14, when embedded in the body 12 form a built in memory device such as is described above with respect to FIG. 3B. Any momentary strain on the body 12 that exceeds the tolerance of a given strain gauge 14 causing it to break will produce a permanent result which can be measured in the future. This provides evidence of the stresses the smart part 10 has been subjected to throughout its history and, in turn, provides a factor to consider when verifying the integrity of the smart part 10.

Figure 12:
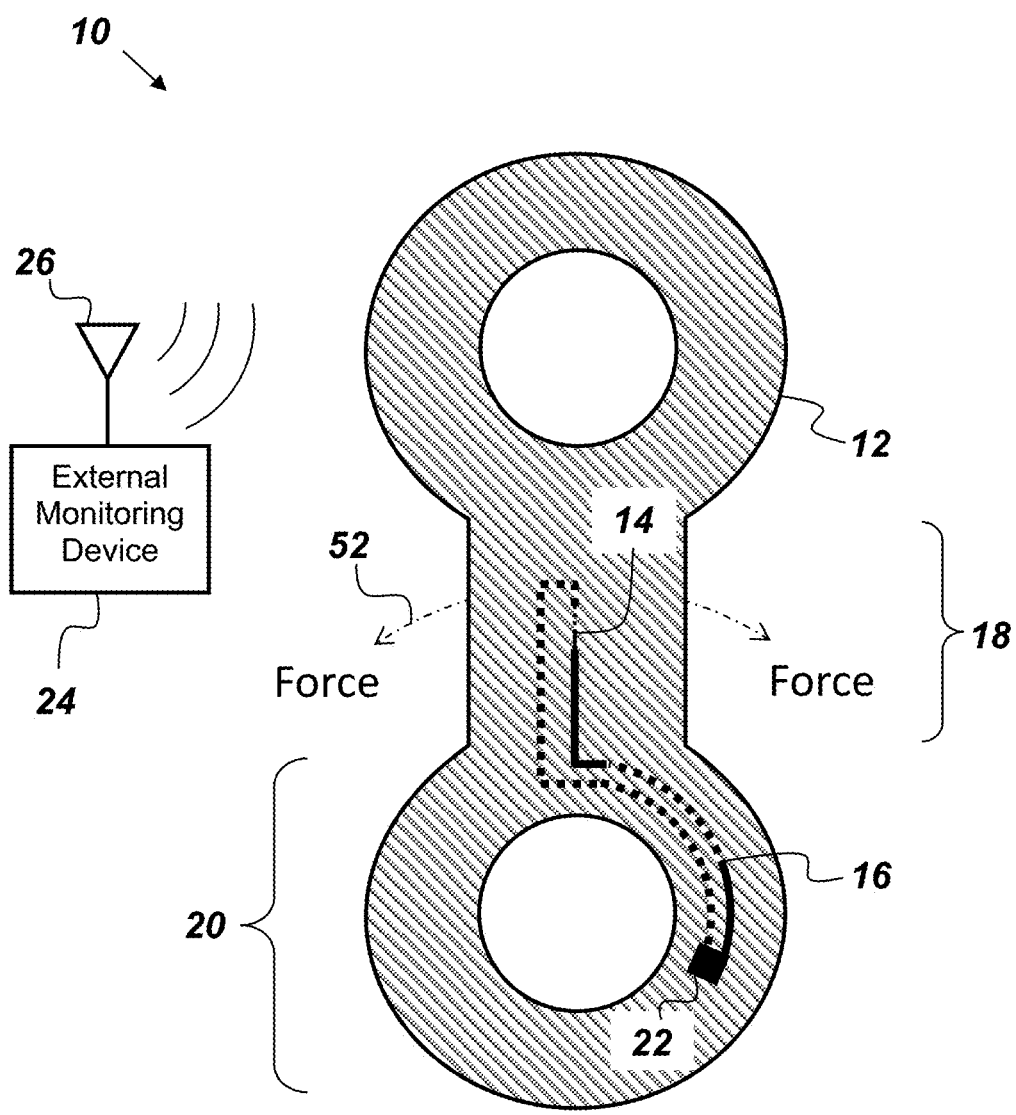
FIG. 12 is a cross-sectional, side-view illustration of an embodiment of a smart part.

FIG. 12 is a cross-sectional, side-view illustration of an embodiment of the smart part 10 being subjected to a rotational force 52. This embodiment of the smart part 10 comprises two temperature sensors 16, one embedded in the low stress section 20, and one embedded in the high stress section 18. Both temperature sensors 16 in this embodiment are thermocouples formed by the junction of dissimilar conductive inks, printed during the AM process such that there is a region where the two dissimilar conductive inks overlap to form the thermocouple. In this embodiment, the same physical feature in the high stress section 18 forms both the strain gauge 14 and a temperature sensor 16 by having a necked-down section comprised of dissimilar conductive inks. If both temperature sensors 16 in this embodiment return the same millivoltage to the RFID transponder 22 then this is an indication that the body 12 is the same temperature throughout and the electrical resistance from the strain gauge 14 is representative of the force 52. The strain millivolt/resistance data is temperature compensated. Strain (i.e., due to the force 52) produces change in resistance of the strain gauge 14. Heat produces change in millivolts from the temperature sensors 16. The solid and dotted traces in FIG. 12 represent dissimilar conductive inks, such as copper and silver alloys, buried inside the body 12.

The smart part 10 solves the part-qualification and file-security problem that has plagued the field of AM parts. The smart part 10 also is capable of providing real time information regarding the performance of the part, which information would provide options to an operator to, for example, run a machine (of which the smart part 10 is a component) hard, knowing that failure is imminent to complete a critical goal. Another option enabled by the smart part 10 includes idling a machine (of which the smart part 10 is a component) while maintaining minimum capability until a repair or replacement is available. Another option enabled by information from the smart part 10 includes justifying shut down or replacement of a machine (of which the smart part 10 is a component). The smart part 10 also enables real-time statistical process control; knowing exactly when the smart part 10 will go off-line, what is wrong, cost of the repair, and time to repair and restore. Great risk exists if a competitor were able to alter an AM printed part file with a hidden failure, such as printing the part with a void or hollow space significantly weakening the part. The smart part 10 enables integral testing which helps avoid the aforementioned problem. For example, if the AM printed part file had been altered it is unlikely the embedded temperature sensor(s) 16 and the strain gauge(s) 14 would be correctly printed since they are printed during the same AM process and would therefore provide an indication that the part has defects. On the other hand, if the strain gauge(s) 14 and the temperature sensor(s) 16 function correctly, it will serve as an indication that the smart part 10 was manufactured correctly—thus providing integral security for the part file and the AM process.

From the above description of the smart part 10, it is manifest that various techniques may be used for implementing the concepts of smart part 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that smart part 10 is not limited to the particular embodiments described herein, but is capable of many embodiments without departing from the scope of the claims.

I claim:

1. A smart part comprising:
   a body, manufactured by a three dimensional (3D) additive manufacturing (AM) process, having interior high-stress and low-stress sections, wherein when the smart part is in operational use the interior low-stress section experiences the lowest amount of physical force exerted on the body;
   a first conductive ink trace embedded within the body, wherein the first conductive ink trace comprises a necked-down section that is located at the interior high-stress section, wherein the first conductive ink trace is configured to produce a variable output representative of a strain experienced by the body at the high-stress section; and
   a second conductive ink trace embedded within the body and located at the interior low-stress section, wherein the second conductive ink trace is configured to produce a variable output based on a temperature of the body at the low-stress section.

2. The smart part of claim 1, wherein the second conductive ink trace comprises a necked-down conductive trace printed on the body's interior low-stress section, and wherein the first and second conductive ink traces are each is configured to produce a variable electrical resistance based on strain experienced by the body at the interior low- and high-stress sections respectively.

3. The smart part of claim 1, further comprising a third conductive ink trace made of a dissimilar metal than the second conductive ink trace, wherein a portion of the third conductive ink trace is printed directly on top of the second conductive ink trace during the AM process to create a thermocouple capable of generating a micro voltage.

4. The smart part of claim 1, wherein the first and second conductive ink traces are electrically coupled to an embedded, passive radio frequency identification (RFID) tag so as to enable wireless power and data transfer to/from the first and second conductive ink traces and an external monitoring device that is configured to calculate a temperature-compensated stress experienced by the smart part based on the outputs of the first and second conductive ink traces.

5. The smart part of claim 1, wherein the body is a pressure vessel.

6. The smart part of claim 5, wherein the pressure vessel is a closed right circular cylinder, wherein the first conductive ink trace is embedded within a middle section of the closed right circular cylinder and the second conductive ink trace is embedded within a base of the closed right circular cylinder.

7. The smart part of claim 1, wherein the body is a mechanical linkage having two pivoting hubs connected by an interconnecting link, and wherein the second conductive ink trace is embedded in one of the pivoting hubs and the first conductive ink trace is embedded within the interconnecting link.

8. The smart part of claim 7, further comprising a plurality of thermocouples connected in series and embedded within the interior high-stress section of the body so as to form a thermopile that generates an alternating current (AC) signal due to physical oscillations of stresses experienced by the body during operation.

9. The smart part of claim 1, further comprising:
a monitoring device connected to the first and second conductive ink traces, wherein the monitoring device is physically mounted within the body;
a display mounted to an exterior surface of the body and electrically connected to the monitoring device; and
wherein the body is a detachable hand grip having an open end and a closed end and configured such that the detachable hand grip may be slid onto a handle of a mechanical hand tool, wherein the second conductive ink trace is embedded in the closed end, and wherein the monitoring device is configured to calculate a temperature-compensated force being applied to the mechanical hand tool based on the outputs of the first and second conductive ink traces, and wherein the display is configured to display the force.

10. The smart part of claim 9, wherein the mechanical hand tool is selected from a group consisting of an adjustable wrench, a pry bar, and a socket wrench.

11. The smart part of claim 1, further comprising a plurality of strain gauges embedded within the body during the AM process, wherein each of the strain gauges is configured to fail after exposure to a different amount of stress so as to give a built-in history of the smart part's exposure to stresses.

12. The smart part of claim 11, further comprising a plurality of temperature sensors embedded within the body during the AM process, wherein each of the temperature sensors is configured to fail after exposure to a different temperature so as to give a built-in history of temperature levels to which the smart part has been exposed.

13. A non-destructive method for testing a three-dimensional (3D), additively manufactured (AM) smart part comprising:
manufacturing a smart part body by a three dimensional (3D) additive manufacturing (AM) process;
printing conductive ink onto an interior high-stress section of the body during the AM process to create a resistive strain gauge embedded within the body;
printing conductive ink onto an interior low-stress section of the body during the AM process to create a temperature sensor embedded within the body, wherein when the smart part is in operational use the high-stress section is subjected to higher stress than the low-stress section and the interior low-stress section experiences the lowest amount of physical force exerted on the body;
receiving outputs from the strain gauge and the temperature sensor at a monitoring device while the smart part is in operational use; and
calculating with the monitoring device a real-time, temperature-compensated stress experienced by the smart part based on the outputs from the strain gauge and the temperature sensor.

14. The method of claim 13, wherein the step of printing conductive ink onto an interior low-stress section of the body during the AM process to create a temperature sensor embedded within the body further comprises printing two different conductive inks, one on top of the other, to form a thermocouple to serve as the temperature sensor.

15. The method of claim 13, further comprising the steps of:
printing during the AM process conductive coils within the body that are connected to the strain gauge and the temperature sensor;
transferring power inductively to the strain gauge and the temperature sensor with the monitoring device without physically contacting the smart part.

16. The method of claim 13, further comprising printing a plurality of strain gauges and temperature sensors within the body during the AM process, wherein each strain gauge is designed to fail after exposure to a different level of stress and each temperature sensor is designed to fail after exposure to a different level of temperature.

17. The method of claim 16, further comprising identifying with the monitoring device which strain gauges and temperature sensors have failed to establish the smart part's temperature and stress history, and determining whether or not the smart part is still serviceable based on the temperature and stress history.

18. The method of claim 13, wherein the monitoring device is external to the body, and wherein the step of receiving outputs from the strain gauge and the temperature sensor at a monitoring device is performed by:
sending with the monitoring device electromagnetic pulses into the body;
harvesting energy from the electromagnetic pulses by a passive radio frequency identification (RFID) transponder that is embedded within the body and electrically connected to the strain gauge and to the temperature sensor;
applying with the RFID transponder an electrical load to the strain gauge and to the temperature sensor;
receiving with the RFID transponder outputs from the strain gauge and the temperature sensor in response to the electrical load; and transmitting the outputs from the RFID transponder to the monitoring device, wherein the smart part does not have any power source other than the harvested energy.

* * * * *